(12) United States Patent
Kim

(10) Patent No.: US 6,256,261 B1
(45) Date of Patent: Jul. 3, 2001

(54) MEMORY DEVICE WITH PACKET COMMAND

(75) Inventor: Jae Hyeong Kim, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/605,007

(22) Filed: Jun. 27, 2000

(30) Foreign Application Priority Data

Jun. 28, 1999 (KR) .................................................. 99-24577

(51) Int. Cl.[7] ...................................................... G11C 8/00
(52) U.S. Cl. ...................... 365/233; 365/221; 365/230.03
(58) Field of Search ............................... 365/233, 230.03, 365/221

(56) References Cited

U.S. PATENT DOCUMENTS

| 5,369,617 | 11/1994 | Munson | 365/219 |
|---|---|---|---|
| 5,889,726 | 3/1999 | Jeddeloh | 365/233 |
| 5,937,436 | 8/1999 | Watkins | 711/202 |
| 6,151,264 | * 11/2000 | Yoo | 365/230.03 |

FOREIGN PATENT DOCUMENTS

| 10283777 | 10/1998 | (JP) . |
|---|---|---|
| 11025696 | 1/1999 | (JP) . |

* cited by examiner

*Primary Examiner*—Son T. Dinh
(74) *Attorney, Agent, or Firm*—Pillsbury Winthrop LLP

(57) ABSTRACT

A memory device, comprising: an interface block for transferring a packet data of selected bits through every data pads at a negative edge and a positive edge of clock signals; a data shift block, in accordance with a load signal from the interface block, for converting the packet data in serial transferred through the interface block and writing the converted data into the core block or converting packet data read from the core block into the serial data and transferring the converted data with a packet type through data pads at a negative edge and a positive edge; and a load signal control means for controlling the load signal to be provided into from the interface block to the data shift block in data read in accordance with a confirming signal for indicating whether the data from the core block is ready to read, or not.

4 Claims, 3 Drawing Sheets

MEMORY DEVICE WITH PACKET COMMAND

BACKGROUND OF THE INVENTION

1. Field of the Invention

This invention relates to a memory device, and more particularly to a memory device with a packet command for accurately transferring data.

2. Description of the Related Art

FIG. 1 shows a block diagram of a conventional memory device with a packet command, for example a RAMBUS DRAM. Referring to FIG. 1, the memory device with a packet command includes: a data shift block 20 for receiving data with a packet type from a core block 10 to convert then into serial data in accordance with a clock signal, or receiving serial data from a data pad block and converting the serial data into parallel data to transfer them with a packet type to the core block 10 to be written therein; and an interface block 30 for receiving the data from the data shift block 20 and transferring packed data with 8-bits to the data pad block 40 in series at both negative and positive edges of the clock signals or transferring the data received from the respective data pads to the interface block in series at negative and positive edges of the clock signals.

The above memory device transfers the data of 1 bit to the interface block 30 at the negative edge and the positive edge of each clock signals in the data write, respectively and packets the data with 8 bits during four cycles every data pads. The data packeted with 8 bits for 4 clock cycles every the data pads are transferred to the data shift block 20 and the serial data are converted into the parallel data and then written into the core block 10.

On the other hand, in the data read, the parallel data read from the core block 10 is converted into the serial data trough the data shift block 20 and the serial data from the shift block 20 is transferred into the data pad block 40 through the interface block 30. The data pad block 40 provides the packet data of 8 bits for 4 cycles every data pads in serial. At this time, the data pad block 40 has 16 data pads and it transfers 16 data per 1.25 ns outwardly. Therefore it has 1.6 gigabits per second(GBps).

According to the prior memory device having the above construction, the data pad block 40 basically has 16 data pads, the data of 16×18 bits (128 bits) are transferred to the data shift block 20 through the interface block 30. So as to load data from the core block 10 to the data shift block 20, the prior memory device always generates a load signal load_rd_pipe, after a constant time is lapsed following the application of the column packet. Although the data is lately read from the core block 10 due to the process error and so on and the skew is occurred in the data path of 128 bits, the load signal load_rd_pipe is generated from the data shift block 20 at a constant time. Therefore, the data is not accurately transferred to the data shift block 20.

SUMMARY OF THE INVENTION

It is an object of the present invention to a packet type memory device for accurately transferring the data by generating a load signal to a data shift block at the time where the data read from a core block is completed.

According to an aspect of the present invention, there is provided to a packet type memory device, comprising: an interface block for transferring a packet data of selected bits through every data pads at both negative and positive edges of clock signals; a data shift block, in accordance with a load signal from the interface block, for converting the packet data in serial transferred through the interface block and writing the converted data into a core block or converting packet data read from the core block into the serial data and transferring the converted data with a packet type through data pads at both negative and positive edges; and a load signal control means for controlling the load signal to be provided into from the interface block to the data shift block in data read in accordance with a confirming signal for indicating whether the data from the core block is ready to read, or not.

The load signal control means includes a first inverter for inverting the load signal from the interface block; a first and a second NOR gates where an output signal from the first inverter is applied as one input, respectively and output signals are cross-coupled with the other input signals; a third NOR gate for receiving an output signal of the first NOR gate and the load signal; and a second inverter for inverting an output signal of the third NOR gate and providing the load signal dependent on the confirming signal to the data shift block.

The load signal controlling means is built in any one of the data shift block or the interface block and the load signal dependant on the confirming signal is transferred to the data shift block, after the confirming signal is generated from the core block.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
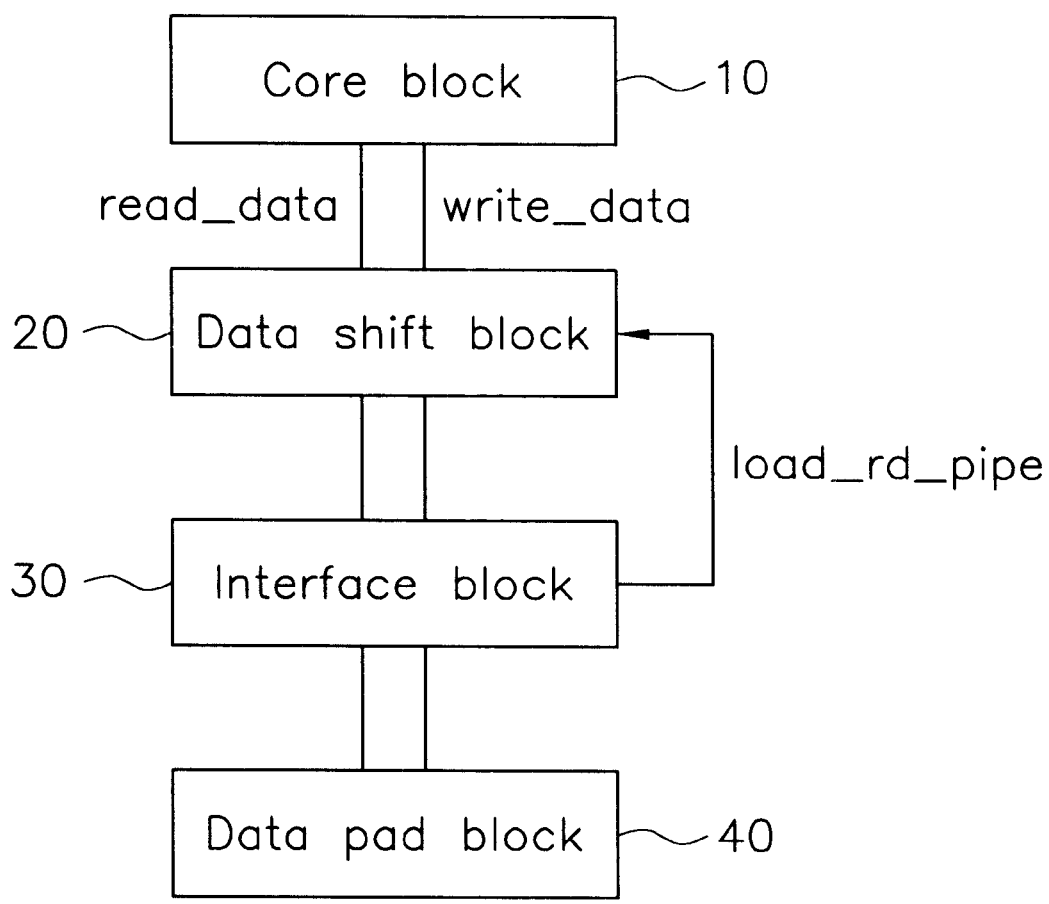
FIG. 1 is a schematic configuration diagram of a packet type memory device in the prior art.
Figure 2:
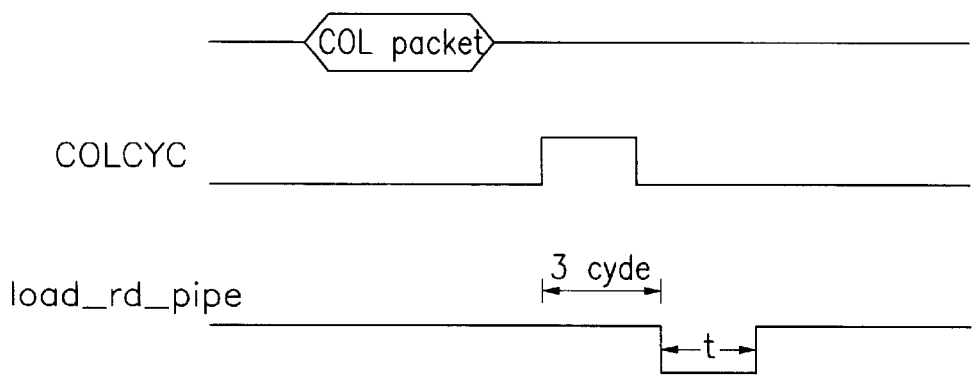
FIG. 2 is a timing diagram of the memory device in FIG. 1.
Figure 3:
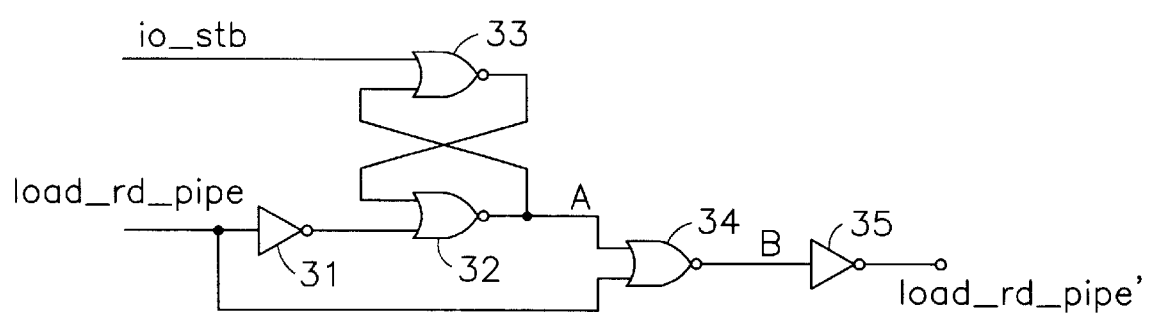
FIG. 3 is a circuit diagram of a load signal control circuit of a packet type memory device in accordance with an embodiment of the present invention.

FIG. 3 shows a circuit diagram of a load signal control circuit of a packet type memory device which controls a load signal from an interface block to be transferred to the data shift block, after the data read is terminated. The packet type memory device of the present invention has the similar construction as the memory device in FIG. 1. The load signal control circuit of FIG. 3 may be constructed in the interface block 20 or the data shift block 20. In the memory device of the present invention, if the load signal load_rd_pipe is generated from the interface block 30, the load signal control circuit generates the load signal load_rd_pipe' dependant on a confirming signal io_stb for indicating the data read termination. Then the data shift block transfers the data in accordance with the load signal lord_rd_pipe' dependent on the confirming signal io_stb.

The load signal control means includes a first inverter 31 for inverting the load signal load_rd_pipe from the interface block 30; a first and a second NOR gates 32 and 33 where an output signal from the first inverter 31 is applied as one input, respectively and output signals are cross-coupled with the other input signals; a third NOR gate 34 for receiving an output signal of the first NOR gate 32 and the load signal load_rd_pipe; and a second inverter 35 for inverting an output signal of the third NOR gate 34 and providing the load signal load_rd_pipe' dependant on the confirming signal io_stb to the data shift block 20.

Figure 4A:
FIG. 4a to FIG. 4e are timing diagrams of the memory device in FIG. 3.

The operation of the memory device having the load signal control circuit will be described with reference to the accompanying timing diagrams. If a control signal for data read COLCYC from the interface block 20 is generated so as to read the data from the core block 10, the confirming signal of high state io_stb as shown in FIG. 4A is generated from the core block 10. Then, the load signal load_rd_pipe is generated from the interface block 30.

Figure 4B:

The load signal control circuit converts the load signal load_rd_pipe in FIG. 4B through the first inverter 21 and provides the output signal of the first inverter 31 to one input of the first NOR gate 32. The load signal control circuit receives the confirming signal io_stb from the core block to provide it to one input of the second NOR gate 33.

Figure 4C:
Figure 4D:
Figure 4E:

Therefore, the first NOR gate 32 generates the output signal as shown in FIG. 4C and the third NOR gate 34 receives the output signal of the first NOR gate 32 and the load signal load_rd_pipe of FIG. 4B to generate the output signal as shown in FIG. 4E. Accordingly, the second inverter 35 inverts the output signal of the third NOR gate 34 to generate the load signal load_rd_pipe' dependant on the confirming signal io_stb as shown in FIG. 4D.

Therefore, the load signal control circuit generates the confirming signal io_stb indicating whether the read readiness of the data is terminated or not through the core block 10, if the control signal COLCYC is generated from the interface block 30 to the core block, So as to read the data from the core block 10. The present invention synchronizes the load signal load_rd_pipe from the interface block 30 through the load signal control circuit with the confirming signal io_stb to generate the load signal load_rd_pipe' dependent on the confirming signal io_stb. If the load signal load_rd_pipe' dependant on the confirming signal io_stb is generated, the data read from the core block 10 is accurately transferred to the data shift block 20. That is, the confirming signal io_stb indicating whether the read readiness of the data is terminated or not is generated from the core block 10 and then the load signal load_rd_pipe' is provided to the core block 10. Accordingly, the effect on the process variation or the parasitic skew on the lay-out is eliminated and the data read from the core block is accurately performed.

According to the present invention, the memory device of the present invention provides the load signal, after the read readiness of the data is terminated, so that the accurate read of the data can be performed. While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A packet type memory device, comprising:

an interface block for transferring a packet data of selected bits through every data pads at a negative edge and a positive edge of clock signals;

a data shift block, in accordance with a load signal from the interface block, for converting the packet data in serial transferred through the interface block and writing the converted data into the core block or converting packet data read from the core block into the serial data and transferring the converted data with a packet type through data pads at a negative edge and a positive edge; and a load signal control means for controlling the load signal to be provided into from the interface block to the data shift block in data read in accordance with a confirming signal for indicating whether the data from the core block is ready to read, or not.

2. The memory device as claimed in claim 1, wherein the load signal controlling means is built in any one of the data shift block or the interface block.

3. The memory device as claimed in claim 2, wherein the load signal control means includes:

a first inverter for inverting the load signal from the interface block;

a first and a second NOR gates where an output signal from the first inverter is applied as one input, respectively and output signals are cross-coupled with the other input signals;

a third NOR gate for receiving an output signal of the first NOR gate and the load signal; and a second inverter for inverting an output signal of the third NOR gate and providing the load signal dependent on the confirming signal to the data shift block.

4. The memory device as claimed in claim 1, wherein the load signal dependent on the confirming signal is transferred to the data shift block, after the confirming signal is generated from the core block.

* * * * *